(12) United States Patent
Lai

(10) Patent No.: US 10,314,137 B1
(45) Date of Patent: Jun. 4, 2019

(54) ADDRESS DETECTIVE METHOD FOR PARALLEL CONNECTION LED LIGHTING SYSTEM AND PARALLEL CONNECTION LED LIGHTING SYSTEM

(71) Applicant: POWER MOS ELECTRONICS LIMITED, Kowloon, Hong Kong (CN)

(72) Inventor: Cheng-Chang Lai, Taipei (TW)

(73) Assignee: POWER MOS ELECTRONICS LIMITED, Kowloon, Hong Kong (CN)

( * ) Notice: Subject to any disclaimer, the term of this patent is extended or adjusted under 35 U.S.C. 154(b) by 0 days.

(21) Appl. No.: 16/170,482

(22) Filed: Oct. 25, 2018

(51) Int. Cl.
   G01R 31/00   (2006.01)
   H05B 33/08   (2006.01)
   H05B 37/02   (2006.01)
   G05B 19/042  (2006.01)
   G01R 31/26   (2014.01)

(52) U.S. Cl.
   CPC ......... H05B 33/089 (2013.01); G05B 19/042 (2013.01); H05B 37/0272 (2013.01); G01R 31/26 (2013.01); G01R 31/2635 (2013.01); G05B 2219/24058 (2013.01); G05B 2219/25179 (2013.01)

(58) Field of Classification Search
   CPC ............................ G01R 31/26; G01R 31/2635
   USPC ............................ 324/750.01, 750.15, 764.01
   See application file for complete search history.

(56) References Cited

U.S. PATENT DOCUMENTS

| | | | | |
|---|---|---|---|---|
| 7,843,150 B2 * | 11/2010 | Wang | ................. | H05B 33/0815 |
| | | | | 315/185 R |
| 8,169,156 B2 * | 5/2012 | Hsu | .................... | H05B 33/0827 |
| | | | | 315/185 S |
| 8,373,364 B2 * | 2/2013 | Santo | ................. | G01R 31/2635 |
| | | | | 315/185 R |

* cited by examiner

*Primary Examiner* — Thuy V Tran
(74) *Attorney, Agent, or Firm* — Birch, Stewart, Kolasch & Birch, LLP

(57) ABSTRACT

An address detective method is executed by a parallel connection LED lighting system, and the parallel connection LED lighting system includes a plurality of the LED devices and a main controller. The main controller generates a testing signal to determine whether the LED devices are abnormal. The main controller further generates a reminder signal to remind a user where an abnormal LED device is. Then, the main controller replaces the address code in an address table which corresponds to the abnormal LED device with the address code of a new LED device. Therefore, the parallel connection LED lighting system can still control each of the LED devices to display a plurality of frames for showing dynamic lighting effects according to the address table. Namely, the user can easily fix the parallel connection LED lighting system.

20 Claims, 6 Drawing Sheets

| SEQUENCE CODE | ADDRESS CODE |
|---|---|
| 1 | AAAA00 |
| 2 | BBBB00 |
| 3 | CCCC00 |
| 4 | DDDD00 |
| 5 | EEEE00 |

FIG. 4

| SEQUENCE CODE | ADDRESS CODE |
|---|---|
| 1 | AAAA00 |
| 2 | BBBB00 |
| 3 | ~~CCCC00~~ |
| 4 | DDDD00 |
| 5 | EEEE00 |

FIG. 5

| SEQUENCE CODE | ADDRESS CODE |
|---|---|
| 1 | AAAA00 |
| 2 | BBBB00 |
| 3 | <u>FFFF00</u> |
| 4 | DDDD00 |
| 5 | EEEE00 |

FIG. 6

ADDRESS DETECTIVE METHOD FOR PARALLEL CONNECTION LED LIGHTING SYSTEM AND PARALLEL CONNECTION LED LIGHTING SYSTEM

BACKGROUND OF THE INVENTION

1. Field of the Invention

The present invention relates to a detective method and a lighting system, and more particularly to an address detective method for a parallel connection LED lighting system and a parallel connection LED lighting system.

2. Description of the Related Art

A common lighting system includes a plurality of LED devices and a controller. The controller is electrically connected to the LED devices, and the LED devices each include a driver IC and R.G.B. LED chips. The drive IC integrates a demodulation logic unit, a driver, and a programmable address construction unit. The controller generates a control signal data to control the LED devices, and the control signal data includes an address code and three color codes.

The address construction unit stores an address code. The driver IC is electrically connected to the address construction unit and the R.G.B. LED chips. When the driver IC receives the control signal data from the controller, the driver IC compares the address code of the control signal data with the address code of the address construction unit. When the driver IC determines that the address code of the control signal data matches the address code of the address construction unit, the driver IC controls the LED unit according to the color codes of the external control signal. Namely, a user can control the LED devices through the external controller.

Further, since the address codes of the LED devices are generated inside the LED devices, the controller can transmit a plurality of control signals to control each of the LED devices based on the address codes of the LED devices to perform any color combination for each LED device. The address codes of the LED devices can be generated to perform any picture frame or dynamic lighting effects.

However, when any one of the LED devices of the lighting system is abnormal, the dynamic lighting effects of the lighting system may be affected. The user may replace the abnormal LED device with a new LED device. The controller can recognize the previously abnormal address code from a memory of the controller only, beside to install the LED device having an exactly same address code. This LED system cannot back to normal. Therefore, the controller cannot transmit any control signal corresponding to the new LED device without the exactly same address code. But it is not possible to prepare every LED device with a spare LED device having a same address code, which will increase huge cost and need expert operator to find and replace it.

Namely, the lighting system cannot be easily fixed by the user, as the user needs to find a vendor of the lighting system to fix the lighting system. It is very inconvenient for the user. Therefore, the common lighting system needs to be further improved.

SUMMARY OF THE INVENTION

An objective of the present invention is to provide an address detective method for a parallel connection LED lighting system and a parallel connection LED lighting system. The present invention can detect an abnormal LED device, and the user can easily fix the parallel connection LED lighting system.

The address detective method and the parallel connection LED lighting system can detect a position of the abnormal LED device. For example, the parallel connection LED lighting system can be switch to a detection mode or a replace mode. A controller of the parallel connection LED lighting system will send a test data base on an exist address table of the parallel connection LED lighting, and the address table record address codes of each LED device of the parallel connection LED lighting system by sequence.

Each LED device will response the equal power consumption as pre-determinate value once the address codes of the LED device match the testing data of the controller.

But the abnormal LED device will perform variance power consumption comparing with the pre-determinate value which can be judged as an abnormal device.

The controller will generate a signal to light up the LED device before the abnormal one to indicate position for a user.

Further, the address detective method and the parallel connection LED lighting system can replace the address code of the abnormal LED device with a new address code of a new LED device.

The user can take out the abnormal LED device, and replace by the new LED device. The total power consumption will increase due to an added standby current of the new LED device. When the controller sense the new LED device been installed, a progress address detection operation will be executed.

When the controller completes the progress address detection operation of the new LED device, and obtain a really address code of the new LED device, the address code of the new LED device will be put the same sequence location in the address table as the previously move out abnormal one.

Moreover, the address detective method and the parallel connection LED lighting system can detect the address code of the new LED device by processing an address detection procedure.

When the controller senses the power consumption increasing and which current changing will be transfer from analog to digital (A/D) to inform a MCU of the controller, and the MCU will start to process the address code detection procedure.

A protocol of the testing data includes an address code and three LED brightness code. The controller will send the testing data from low to high for each level of the address code by sequence. When the address code of the testing data match the address code of the LED device, the LED device will be light up and perform pre-setting current. The controller can sense this changing and treat this address code of the new LED device is same as a teasing code, then put new code in a memory of the controller the same sequence position in the address table.

To sum up, the address detective method includes steps of:

generating a testing signal corresponding to a sequence code in an address table, and transmitting the testing signal to the LED devices;

determining whether a sum of consumption values of the LED devices increases by a first predetermined value; and when the sum does not increase by the first predetermined value, generating a reminder signal, and transmitting the reminder signal to the LED devices;

determining whether the sum increases by a second predetermined value;

when the sum increases by the second predetermined value, detecting an address code of a new LED device; and replacing an address code in the address table which corresponds to the current testing signal with the detected address code of the new LED device.

Further, the parallel connection LED lighting system includes a plurality of the LED devices and a main controller.

The LED devices each include an LED lighting unit and an LED processing unit. The LED processing unit is electrically connected to the LED lighting unit, and controls the LED lighting unit.

The main controller is electrically connected to the LED devices, and includes a storage unit and a main processing unit. The storage unit stores an address table.

The main processing unit is electrically connected to the storage unit. The main processing unit generates a testing signal corresponding to a sequence code in an address table, and transmits the testing signal to the LED devices. The main processing unit further determines whether a sum of consumption values of the LED devices increases by a first predetermined value. When the sum does not increase by the first predetermined value, the main processing unit generates a reminder signal, and transmitting the reminder signal to the LED devices.

The main processing unit of the main controller further determines whether the sum increases by a second predetermined value. When the sum increases by the second predetermined value, the main processing unit detects an address code of a new LED device, and replaces the address code in the address table which corresponds to the current testing signal with the detected address code of the new LED device.

When the LED devices receive the testing signal from the main controller, normally, the LED device can light up according to the testing signal. When the LED device can light up, the consumption values of the LED devices will increase by the first predetermined value.

Namely, when the sum of the consumption values of the LED devices does not increase by the first predetermined value, the parallel connection LED lighting system includes at least one abnormal LED device. Further, the parallel connection LED lighting system can determine the address code of the abnormal LED device according to the testing signal, and the parallel connection LED lighting system can remind the user of a location that is near the abnormal LED device according to the reminder signal.

Moreover, when the user replaces the abnormal LED device with the new LED device, the parallel connection LED lighting system can detect the address code of the new LED device, and replaces the address code in the address table which corresponds to the current testing signal with the detected address code of the LED device. Therefore, the parallel connection LED lighting system can still control each of the LED devices to display a plurality of frames for showing dynamic lighting effects according to the address table. Namely, the user can easily fix the parallel connection LED lighting system.

BRIEF DESCRIPTION OF THE DRAWINGS

FIGS. 4 to 6 are schematic diagrams of embodiments of an address table of the present invention.

DETAILED DESCRIPTION OF THE INVENTION

Figure 1:
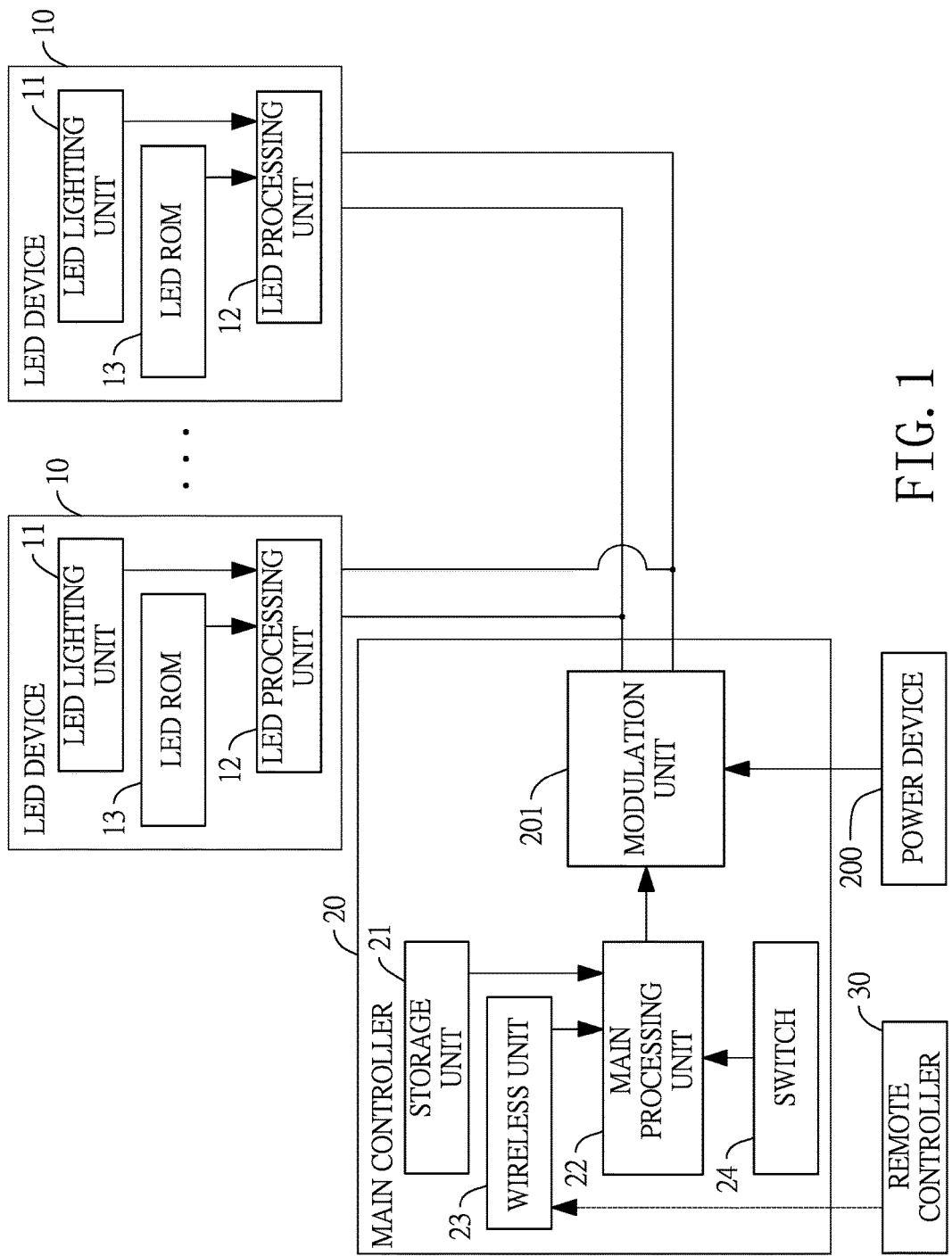
FIG. 1 is a block diagram of an embodiment of a parallel connection LED lighting system of the present invention.

With reference to FIG. 1, the present invention relates to an address detective method for a parallel connection LED lighting system and a parallel connection LED lighting system.

The parallel connection LED lighting system includes a plurality of the LED devices 10 and a main controller 20.

The LED devices 10 are electrically connected in parallel, and the LED devices 10 each include an LED lighting unit 11 and an LED processing unit 12. The LED processing unit 12 is electrically connected to the LED lighting unit 11, and controls the LED lighting unit 11.

The main controller 20 is electrically connected to the LED devices 10, and the main controller 20 includes a storage unit 21 and a main processing unit 22. The storage unit 21 stores an address table.

The main processing unit 22 is electrically connected to the storage unit 21. The main processing unit 22 generates a testing signal corresponding to a sequence code in the address table, and transmits the testing signal to the LED devices. The main processing unit 22 further determines whether a sum of the consumption values of the Led device 10 increases by a first predetermined value. When the sum does not increase by the first predetermined value, the main processing unit 22 generates a reminder signal, and transmitting the reminder signal to the LED devices 10.

The main processing unit 22 of the main controller 20 further determines whether the sum increases by a second predetermined value. When the sum increases by the second predetermined value, the main processing unit 22 detects an address code of a new LED device, and replaces the address code in the address table which corresponds to the current testing signal with the detected address code of the new LED device.

In the embodiment, the main controller 20 further includes a modulation unit 201, and the main processing unit 22 is electrically connected to the LED devices 10 through the modulation unit 201. The modulation unit 201 further electrically connected to a power device 200, and the modulation unit 201 modulates signals from the main processing unit 22 and electric power from the power device 200. Therefore, the main controller 20 can transmit signals to the LED device 20 on power lines. Namely, the main controller 20 can electrically connected to the LED device 10 by just two lines for simultaneously transmitting the electric power and the signals.

Figure 2:
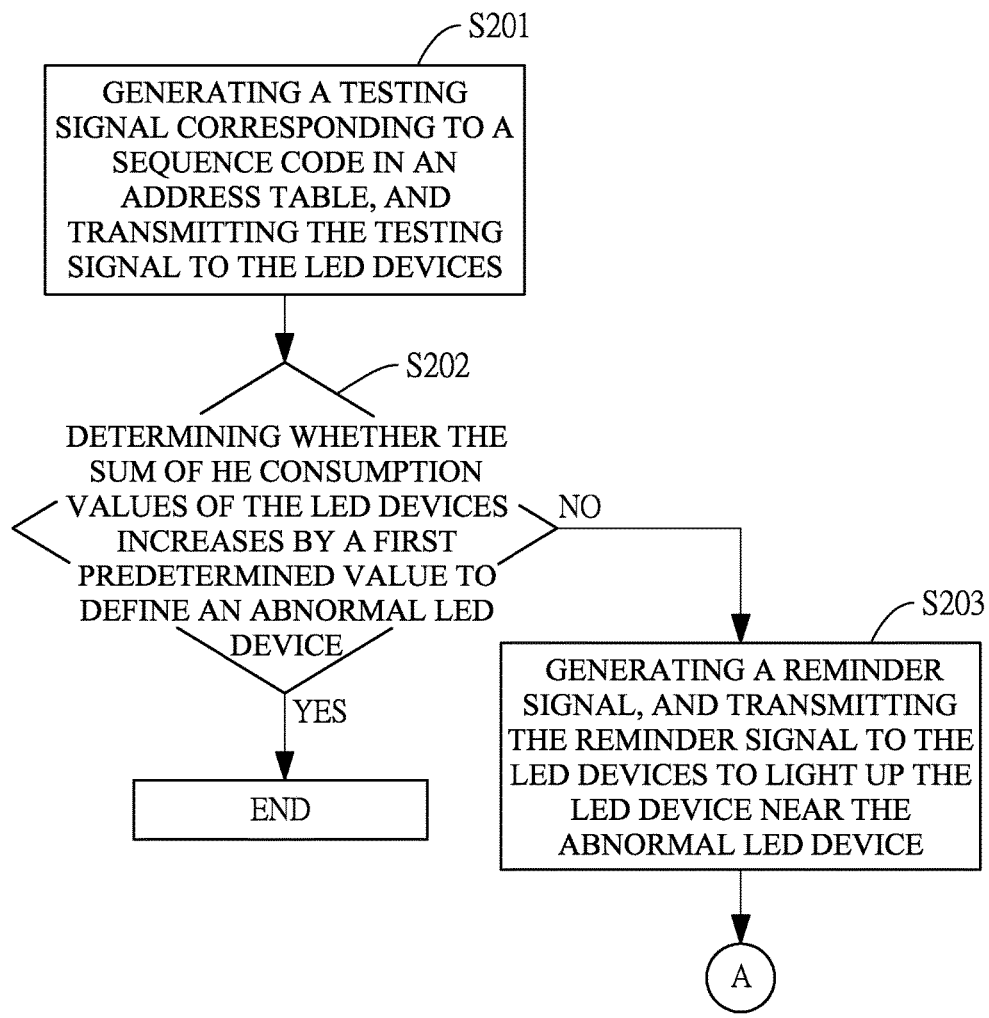
FIGS. 2 and 3 are flowcharts of an embodiment of an address detective method for a parallel connection LED lighting system of the present invention.
Figure 3:
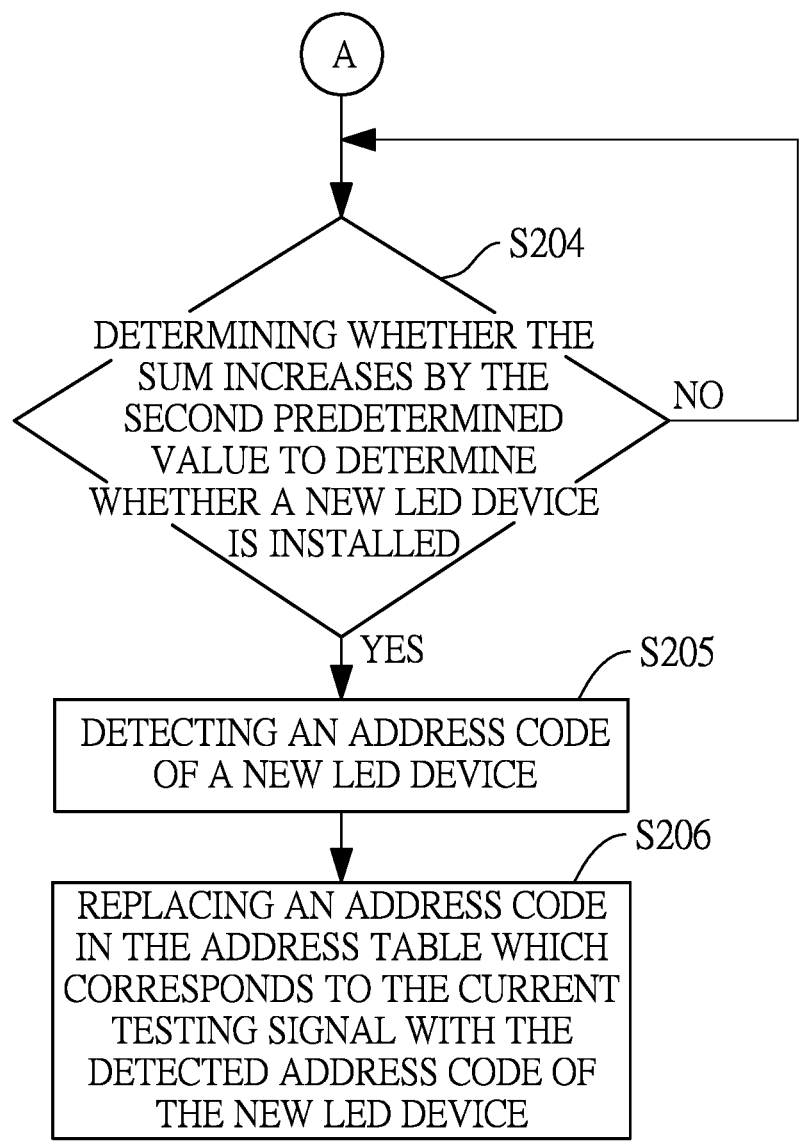

Further, with reference to FIGS. 2 and 3, the address detective method is executed by the main processing unit 22 of the main controller 20, and includes steps of:

generating a testing signal corresponding to a sequence code in an address table, and transmitting the testing signal to the LED devices (S201);

determining whether the sum of the consumption values of the LED devices increases by a first predetermined value to define an abnormal LED device (S202);

when the sum does not increase by the first predetermined value, generating a reminder signal, and transmitting the reminder signal to the LED devices to light up the LED device near the abnormal LED device (S203);

determining whether the sum increases by the second predetermined value to determine whether a new LED device is installed (S204);

when the sum increases by the second predetermined value, detecting an address code of a new LED device (S205); and replacing an address code in the address table which corresponds to the current testing signal with the detected address code of the new LED device (S206).

The parallel connection LED lighting system has a normal working mode and a LED device installation or replacing mode. When the parallel connection LED lighting system executes the LED device installation or replacing mode, there are three conditions that have to be fulfilled for this function. Firstly, the LED devices 10 need to be electrically connected in parallel. Secondly, only one LED device can be installed or replaced each time. Thirdly, the parallel connection LED lighting system has to be carried out under a power on condition.

When a user receives the parallel connection LED lighting system first time, and the user switches the parallel connection LED lighting system to the LED device installation or replacing mode, the main controller 20 will detect the sum of the consumption values of the LED devices 10.

The principle of detecting is based on the consumption value of the LED device in a standby mode.

Normally, the consumption value of the LED device in the standby mode is a fixed value. Therefore, when the sum of the consumption values in the standby mode is changed, a new LED device is installed into the parallel connection LED lighting system, or at least one of the LED devices is abnormal. Namely, the address detective method and the parallel connection LED lighting system can determine whether the new LED device is installed or whether the LED devices 10 are abnormal according to the sum of the consumption values.

For example, the consumption value of the LED device in the standby mode may be 2 microamperes (mA). At beginning, the parallel connection LED lighting system includes two LED devices, and the sum of the consumption values of the LED devices in the standby mode is 4 mA. When the sum is lower than 4 mA, at least one LED device is abnormal, or one LED device is removed. When the sum is greater than 4 mA, one LED device is installed in to the parallel connection LED lighting system.

Further, when there is at least one abnormal LED device in the parallel connection LED lighting system, the parallel connection LED lighting system can determine the address code of the abnormal LED device according to the testing signal.

For example, the main processing unit 22 can control the LED devices 10 according to the testing signal. When the LED device 10 receives the testing signal, the LED device 10 may respond to the testing signal. The LED device 10 may light up in a particular color. When the LED device 10 lights up in a particular color, the consumption value of the LED device 10 may increase from 2 mA to 10 mA. Namely, when the consumption value of the LED device 10 can increases by the first predetermined value, such as 8 mA, the LED device 10 is normal.

On the other hand, when the consumption value of the LED device 10 cannot increase by 8 mA, the LED device 10 cannot normally respond to the testing signal. Therefore, the LED device 10 is abnormal. Further, since the testing signal corresponds to the sequence code in the address table, the main processing unit 22 can determine the sequence code corresponding to the abnormal LED device 10. In the embodiment, the testing signal and the reminder signal each comprise a respective address code and a respective color code. Further, with reference to FIG. 4, the address table includes the sequence codes and address codes corresponding to the sequence codes. In the embodiment, the color code is a RGB color code.

For further example, as for a replace mode, the main controller 20 will send testing data based on the address table. Signal data includes address code and RGB brightness code. When the address code of the testing data matches the address code existed in the LED device 10. The LED device 10 will be light up and perform power consumption. The main controller 20 can sense this current changing to recognize the abnormal device.

For example, there are ten LED devices 10 in a string, and the fourth LED device 10 is broken. The main controller 20 will send the address code from the address code of the first LED device 10 to the address code of the tenth LED device 10 with RGB data (20 mA). All of them will get response from the LED devices 10 by 20 mA, but the fourth LED device 10 has no such current response. So the controller can judge the fourth LED device 10 was broken.

The main controller 20 will send a dedicate color signal to the device where before the abnormal one to light up as marking. User can easy to find the abnormal device.

The user can take out the abnormal LED device and replaced by a new LED device. When the new LED device been installed, the internal standby current of the new LED device will cause system power consumption increasing. The main controller 20 can sense this current changing to activate address searching function.

In the searching address mode, the main controller 20 will send the address code from low to high individually to compare the address code of the LED device 10. Once the address code from the main controller 20 matches the address code of the LED device 10, the LED device 10 will light up based on signal data. It will generate power consumption from the LED devices 10. The main controller can recognize it and define the really address code for this LED device 10.

This address code of the new LED device will be putted in the storage unit of the main controller with previously sequence code to finish replacement.

As for start installation mode, the main controller 20 will under the sense situation to wait current changing signal.

When a new LED device been installed, the main controller 20 will detect that the sum of the consumption values of the LED devices increases by a first predetermined value, and main controller 20 will activate an address searching procedure to get right address code. This new address code of the new LED device will be integrate a sequence code and put in the storage unit 21 of the main controller 20. To repeat this installation operation, the main controller 20 will keep searching the address code of the new LED device and integrate the new address code with sequence code from low to high to store in the storage unit 21 of the main controller 20.

Moreover, the parallel connection LED lighting system can remind the user of a location that is near the abnormal LED device according to the reminder signal.

In the embodiment, the reminder signal corresponds to a preceding sequence code which precedes a current sequence code corresponding to the current testing signal, and the address table is established according to installation orders of the LED devices.

For example, a first installed LED device placed at a first location has the sequence code 1, and a second installed LED device placed at a second location near the first location has the sequence code 2. The sequence code 1 corresponds to the address code of the first installed LED device in the address table, and the sequence code 2 corresponds to the address code of the second installed LED device in the address table. When the current testing signal corresponds to the sequence code 2 and the consumption value of the second installed LED device cannot increase by 8 mA, the second installed LED device is determined to be an abnormal LED device. The reminder signal is generated corresponding to the sequence code 1, and the first installed LED device responds to the reminder signal to light up in another particular color. The user can easily find the lit device. Since the first installed LED device is near the second installed LED device, the user can also easily find the second installed LED device near the first installed LED device.

In another embodiment, the reminder signal corresponds to a following sequence code which follows a current sequence code corresponding to the current testing signal, and the address table is established according to installation orders of the LED devices.

Namely, when the second installed LED device is determined to be an abnormal LED device, the third installed LED device will respond to the reminder signal to light up in another particular color.

Further, when the user replaces the abnormal LED device with a new LED device, the parallel connection LED lighting system can detect the address code of the new LED device, and replaces the address code in the address table which corresponds to the current testing signal with the detected address code of the new LED device.

For example, when a new LED device is installed in the parallel connection LED lighting system, the sum of the consumption values of the LED devices in the standby mode may increase by 2 mA. Namely, when the main processing unit 22 detects that the sum increases by the second predetermined value, the parallel connection LED lighting system will determine that the new LED device is installed into the parallel connection LED lighting system. At the same time, the main processing unit 22 will quickly search for the address code of the new LED device.

The address code of the new LED device is quickly searched based on the below bases.

The LED processing units 12 has a programmable fuse by metal or poly process, by using trimming technology to define digital address code. The trimming technology can be selected by external controllable current pulse or by laser.

Management of the production lot can ensure that each LED device used in the same environment has unique address code.

Further, the LED device 10 includes the LED lighting unit 11 and the LED processing unit 12, and the LED processing unit 12 can authorizes the testing signal or the reminder signal. When the testing signal or the reminder signal is authorized, the LED processing unit 12 controls the LED lighting unit 11 according to the color code of the testing signal, and the consumption values of the LED devices will accordingly increased. Then, the LED processing unit 12 can detect changes of the consumption values of the LED devices.

Moreover, to avoid spending too much time doing address code detecting, the main processing unit 22 separates the address code in segmentations, and integrates each of processed segmentations of the address code to get the complete address code of the LED device 10.

The main processing unit 22 transmits the testing signal having the address code and the color code, and the modulation unit 201 will modulate the testing signal with the electric power to be transmitted to the dedicated LED device 10. Transmission order of the segmentations of the address code is from low bits to high bits, and the LED processing unit 12 will authorizes the segmentations of the address code according to the transmission order.

When the segmentations of the address code can be authorized, the LED processing unit 12 will light up the LED lighting unit 11 according to the color code. The main processing unit 22 can determine the real address code of the new LED device by the increase of the consumption value of the new LED device. The main controller 20 confirms the address code of the new LED device segment by segment, until the main controller 20 can integrate and detect the complete address code of the new LED device.

When the address code of the new LED device is detected, the main processing unit 22 replaces the address code in the address table which corresponds to the current testing signal with the detected address code of the new LED device.

For example, with reference to FIGS. 5 and 6, when the current testing signal corresponds to the address code "CCCC00" which corresponds to the sequence code 3 in the address table, and when a consumption value of a third installed LED device cannot increase by 8 mA, the third installed LED device corresponding to the sequence code 3 is determined to be abnormal. Then, the main processing unit 22 detects the address code of the new LED device, such as "FFFF00", and replaces the address code, "CCCC00", with the detected address code, "FFFF00".

Therefore, the parallel connection LED lighting system can still control each of the LED devices to display a plurality of frames for showing dynamic lighting effects according to the sequence code of the address table. Namely, the user can easily replace an abnormal LED device with a new one to fix the parallel connection LED lighting system, and the parallel connection LED lighting system can still normally operate.

In conclusion, when the main controller 20 detects the address code of the LED device 10, the main controller 20 will arrange the address codes of the LED device 10 is time order in the storage unit 21 of the main controller 20. Each address codes is assigned with a time sequence number, making it easy for external data to control the LED device 10 through set time sequence. For instance, the LED devices are installed one by one in a fixed direction, the detected address codes of the LED devices and time sequences of the installation orders of the LED devices will match with the actual mechanical sequence. This is very convenient for the light string application.

The main controller 20 can find the location of each LED device 10 based on sequence codes of the LED devices 10 that linked with the address codes of the LED device 10. It can further transfer the content of the color code to enable externally controllable color changing.

Moreover, with reference to FIG. 1, when the LED processing unit 12 of the LED device 10 receives the testing signal, the LED processing unit 12 authorizes the address code of the testing signal. When the address code of the testing signal is authorized, the LED processing unit 12 controls the LED lighting unit 11 according to the color code of the testing signal.

Similarly, when the LED processing unit 12 of the LED device 10 receives the reminder signal, the LED processing unit 12 authorizes the address code of the reminder signal. When the address code of the reminder signal is authorized, the LED processing unit 12 controls the LED lighting unit 11 according to the color code of the reminder signal.

The LED devices 10 each further comprise a respective LED read only memory (ROM) 13. The LED ROM 13 stores an address code, and is electrically connected to the LED processing unit 12.

When the LED processing unit 12 of the LED device 10 receives the testing signal, the LED processing unit 12 determines whether the address code of the testing signal matches with the address code stored in the LED ROM 13. When the address code of the testing signal matches with the address code stored in the LED ROM 13, the address code of the testing signal is authorized.

Similarly, when the LED processing unit 12 of the LED device 10 receives the reminder signal, the LED processing unit 12 determines whether the address code of the reminder signal matches with the address code stored in the LED ROM 13.

When the address code of the reminder signal matches with the address code stored in the LED ROM 13, the address code of the reminder signal is authorized.

Since the LED processing unit 12 further includes the LED ROM 13 storing the address code, the LED processing unit 12 can authorize the address code of the testing signal or the reminder signal by matching the address code of the testing signal or the reminder signal with the address code stored in the LED ROM 13.

Namely, the LED device 10 just responds to the authorized testing signal or the authorized reminder signal, and the LED device 10 may not malfunction to respond to noise signals.

The parallel connection LED lighting system further includes a remote controller 30. The remote controller 30 generates a remote signal, and wirelessly transmits the remote signal.

The main controller 20 further comprises a wireless unit 23, and the main processing unit 22 is electrically connected to the wireless unit 23. The main processing unit 22 of the main controller 20 is wirelessly connected to the remote controller 30 through the wireless unit 23 to receive the remote signal.

The main processing unit 22 does not determine whether the sum is lower than a threshold value until the main processing unit 22 receives the remote signal.

Namely, the main processing unit 22 may not execute the step of "determining whether a sum of consumption values of the LED devices is lower than a threshold value", until the main processing unit 22 receives the remote signal.

Therefore, the user can use the remote controller 30 to remotely control the parallel connection LED lighting system. For example, the user may press a "test" button on the remote controller 30, and the remote controller 30 generates the remote signal. Then, the main processing unit 22 may determine whether the sum of the consumption values of the LED devices is lower than the threshold value to determine whether any one of the LED devices is abnormal. The user may conveniently control the parallel connection LED lighting system.

Further, the main controller includes a switch 24. The switch 24 is electrically connected to the main processing unit 22, and generates a control signal.

The main processing unit 22 does not determine whether the sum is lower than the threshold value until the main processing unit 22 receives the control signal from the switch 24.

Namely, when the remote controller 30 is abnormal, the user can still use the switch 24 to generate the control signal. Then, the main processing unit 22 may determine whether the sum of the consumption values of the LED devices is lower than the threshold value to determine whether the LED devices are abnormal.

Figure 7:
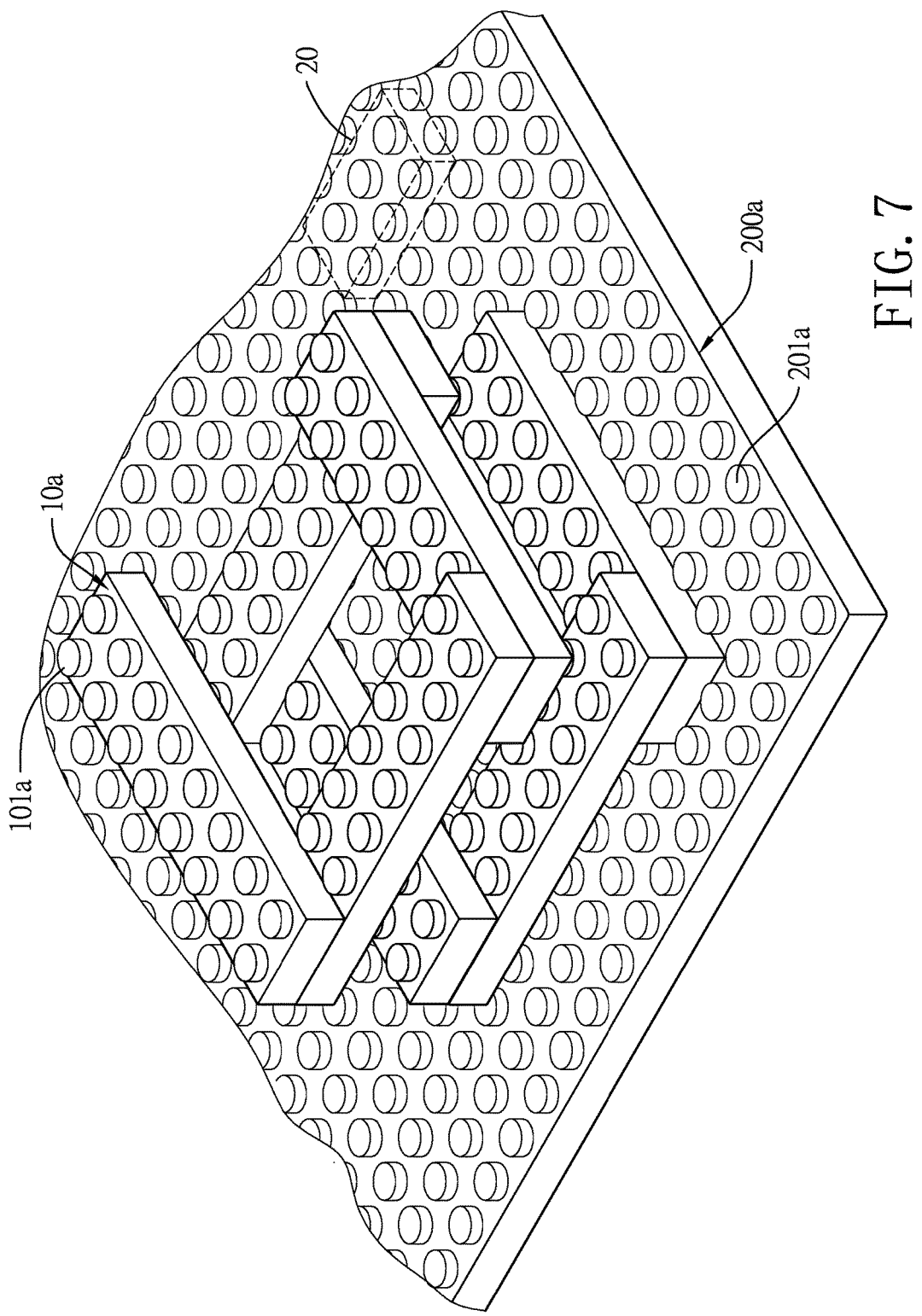
FIG. 7 is a schematic diagram of an embodiment of the parallel connection LED lighting system of the present invention.

With reference to FIG. 7, in the embodiment, the LED devices 10 are each a luminous brick 10a. The luminous brick 10a includes two electrodes 101a. The main controller 20 is installed in a brick building base plate 200a, and the brick building base plate 200a includes a plurality of electrodes 201a. When the luminous brick 10a is built on the brick building base plate 200a, the luminous brick 10a can be electrically connected to the main controller 20 through the electrodes 101a of the luminous brick 10a and the electrodes 201a of the brick building base plate 200a.

To sum up, when the main controller 20 enters the installation mode or the replacement mode, the main controller 20 will sent out the testing signal to the LED devices 20 based on the address table. When one of the LED devices 20 cannot be light up due to a malfunction of the LED lighting unit 11 or the LED processing unit 12, the main controller 20 will detect the LED device 20 is abnormal. The main controller 20 will transmit the reminder signal, such as a green light signal, to the LED device sequence before the abnormal one to detect the location of the abnormal LED device. The main controller will delete the address code of the abnormal LED device after comparing with the address table, but still keep the previously given sequence code.

When replacing an abnormal LED device with a new LED device under powered state, the main controller 20 will detect the joining of new LED device by the increase of the sum of the consumption values, and therefore automatically enter the address searching mode until the main controller 20 detects the address code of the new LED device. It will then match such address code with the sequence code of the previously removed LED device.

When there are multiple abnormal LED devices in the same parallel connection LED lighting system, the main controller 20 will find the abnormal LED device which is closest to it and send out green light signal. After replacing the closest abnormal LED, the main controller 20 will carry on searching for other abnormal LED devices one by one, until the whole system become fully functional.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An address detective method for a parallel connection LED lighting system comprising a plurality of LED devices connected in parallel, comprising steps of:

generating a testing signal corresponding to a sequence code in an address table, and transmitting the testing signal to the plurality of LED devices;

determining whether a sum of consumption values of the plurality of LED devices increases by a first predetermined value to define an abnormal LED device; and when the sum does not increase by the first predetermined value, generating a reminder signal, and transmitting the reminder signal to the plurality of LED devices;

determining whether the sum increases by a second predetermined value;

when the sum increases by the second predetermined value, detecting an address code of a new LED device which is installed for a replacement of the abnormal LED device; and replacing an address code in the address table which corresponds to a current testing signal with the detected address code of the new LED device.

2. The address detective method as claimed in claim 1, wherein the reminder signal corresponds to a preceding sequence code which precedes a current sequence code corresponding to the current testing signal.

3. The address detective method as claimed in claim 1, wherein the reminder signal corresponds to a following sequence code which follows a current sequence code corresponding to the current testing signal.

4. The address detective method as claimed in claim 1, wherein the testing signal and the reminder signal each comprise address codes and color codes.

5. The address detective method as claimed in claim 1, wherein the address table comprises the sequence codes and address codes corresponding to the sequence codes.

6. The address detective method as claimed in claim 1, wherein the address table is established according to installation orders of the plurality of LED devices.

7. A parallel connection LED lighting system, comprising:

a plurality of LED devices, electrically connected in parallel, and each comprising:
an LED lighting unit;
an LED processing unit, electrically connected to the LED lighting unit, and controlling the LED lighting unit;

a main controller, electrically connected to the plurality of LED devices, and comprising:
a storage unit, storing an address table; and
a main processing unit, electrically connected to the storage unit; wherein the main processing unit generates a testing signal corresponding to a sequence code in the address table, and transmits the testing signal to the plurality of LED devices; wherein the main processing unit further determines whether a sum of consumption values of the plurality of LED devices increases by a first predetermined value to define an abnormal LED device; wherein when the sum does not increase by the first predetermined value, the main processing unit generates a reminder signal, and transmits the reminder signal to the plurality of LED devices;

wherein the main processing unit of the main controller further determines whether the sum increases by a second predetermined value;

wherein when the sum increases by the second predetermined value, the main processing unit detects an address code of a new LED device which is installed for a replacement of the abnormal LED device, and replaces an address code in the address table which corresponds to a current testing signal with the detected address code of the new LED device.

8. The parallel connection LED lighting system as claimed in claim 7, further comprising:
a modulation unit; wherein the main processing unit is electrically connected to the plurality of LED devices through the modulation unit;
wherein the modulation unit is further electrically connected to a power device, and the modulation unit modulates signals from the main processing unit and electric power from the power device.

9. The parallel connection LED lighting system as claimed in claim 7, wherein the reminder signal corresponds to a preceding sequence code which precedes a current sequence code corresponding to the current testing signal.

10. The parallel connection LED lighting system as claimed in claim 7, wherein the reminder signal corresponds to a following sequence code which follows a current sequence code corresponding to the current testing signal.

11. The parallel connection LED lighting system as claimed in claim 7, wherein the testing signal and the reminder signal each comprise address codes and color codes.

12. The parallel connection LED lighting system as claimed in claim 11, wherein when the LED processing unit of each of the LED devices receives the testing signal, the LED processing unit authorizes the address code of the testing signal;
wherein when the address code of the testing signal is authorized, the LED processing unit controls the LED lighting unit according to the color code of the testing signal.

13. The parallel connection LED lighting system as claimed in claim 12, wherein the plurality of LED devices each further comprise a respective LED read only memory (ROM);
wherein the LED ROM stores an address code and is electrically connected to the LED processing unit;
wherein when the LED processing unit of each of the LED devices receives the testing signal, the LED processing unit determines whether the address code of the testing signal matches with the address code stored in the LED ROM;
wherein when the address code of the testing signal matches with the address code stored in the LED ROM, the address code of the testing signal is authorized.

14. The parallel connection LED lighting system as claimed in claim 12, further comprising:
a remote controller, generating a remote signal, and wirelessly transmitting the remote signal;
wherein the main controller further comprises a wireless unit, and the main processing unit is electrically connected to the wireless unit;
wherein the main processing unit of the main controller is wirelessly connected to the remote controller through the wireless unit to receive the remote signal;
wherein the main processing unit does not determine whether the sum is lower than a threshold value until the main processing unit receives the remote signal.

15. The parallel connection LED lighting system as claimed in claim 12, wherein the main controller further comprises:
a switch, electrically connected to the main processing unit, and generating a control signal;
wherein the main processing unit does not determine whether the sum is lower than a threshold value until the main processing unit receives the control signal from the switch.

16. The parallel connection LED lighting system as claimed in claim 11, wherein when the LED processing unit of each of the LED devices receives the reminder signal, the LED processing unit authorizes the address code of the reminder signal;

wherein when the address code of the reminder signal is authorized, the LED processing unit controls the LED lighting unit according to the color code of the reminder signal.

17. The parallel connection LED lighting system as claimed in claim 16, wherein the plurality of LED devices each further comprise a respective LED read only memory (ROM);

wherein the LED ROM stores an address code and is electrically connected to the LED processing unit;

wherein when the LED processing unit of each of the LED devices receives the reminder signal, the LED processing unit determines whether the address code of the reminder signal matches with the address code stored in the LED ROM;

wherein when the address code of the reminder signal matches with the address code stored in the LED ROM, the address code of the reminder signal is authorized.

18. The parallel connection LED lighting system as claimed in claim 7, wherein the address table comprises the sequence codes and address codes corresponding to the sequence codes.

19. The parallel connection LED lighting system as claimed in claim 7, wherein the address table is established according to installation orders of the plurality of LED devices.

20. The parallel connection LED lighting system as claimed in claim 7, wherein the plurality of LED devices are each a luminous brick;

wherein the luminous brick includes two electrodes;

wherein the main controller is installed in a brick building base plate, and the brick building base plate includes a plurality of electrodes;

wherein the luminous brick is electrically connected to the main controller through the plurality of electrodes of the luminous brick and the electrodes of the brick building base plate.

\* \* \* \* \*